(12) United States Patent
Pan et al.

(10) Patent No.: US 11,222,675 B2
(45) Date of Patent: Jan. 11, 2022

(54) MEGNETORESISTIVE RANDOM ACCESS MEMORY

(71) Applicant: Yangtze Memory Technologies Co., Ltd., Wuhan (CN)

(72) Inventors: Xuwen Pan, Wuhan (CN); Gang Yuan, Wuhan (CN); Nan Peng, Wuhan (CN); Wuyao Cai, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 0 days.

(21) Appl. No.: 16/849,642

(22) Filed: Apr. 15, 2020

(65) Prior Publication Data
US 2021/0193205 A1    Jun. 24, 2021

Related U.S. Application Data

(63) Continuation of application No. PCT/CN2019/127828, filed on Dec. 24, 2019.

(51) Int. Cl.
*G11C 11/00*      (2006.01)
*G11C 11/16*      (2006.01)
(Continued)

(52) U.S. Cl.
CPC ........ *G11C 11/161* (2013.01); *G11C 11/1655* (2013.01); *G11C 11/1659* (2013.01);
(Continued)

(58) Field of Classification Search
CPC .............. G11C 11/161; G11C 11/1673; G11C 11/1675; G11C 11/1655; G11C 11/1659; H01L 43/10; H01L 43/04
See application file for complete search history.

(56) References Cited

U.S. PATENT DOCUMENTS 10,326,073 B1 *  6/2019  Tzoufras ................. H01L 43/06
2003/0169147 A1 *  9/2003  Higo ....................... G11C 11/161
                                                                                    338/32 R
(Continued)

FOREIGN PATENT DOCUMENTS

CN         1750168 A       3/2006
CN       101621113 A       1/2010
(Continued)

OTHER PUBLICATIONS

The World Intellectual Property Organization (WIPO) International Search Report for PCT/CN2019/127828 dated Oct. 12, 2020 4 pages.

*Primary Examiner* — Uyen Smet
(74) *Attorney, Agent, or Firm* — Anova Law Group, PLLC

(57) ABSTRACT

A magnetic memory device includes a core element, a free layer surrounding the core element, a barrier layer surrounding the free layer, and a reference layer surrounding the barrier layer. Two ends of the core element are electrically coupled to a first electrode and a second electrode, respectively. A direction of magnetization of the free layer is switchable between a first direction and a second direction under an influence of an electrical current flowing along the core element. The barrier layer includes an electrically insulating material. The reference layer is electrically coupled to a third electrode. A direction of magnetization of the reference layer remains along the first direction or the second direction.

18 Claims, 5 Drawing Sheets

(51) Int. Cl.
  *H01L 43/04* (2006.01)
  *H01L 43/10* (2006.01)
(52) U.S. Cl.
  CPC ...... *G11C 11/1673* (2013.01); *G11C 11/1675* (2013.01); *H01L 43/04* (2013.01); *H01L 43/10* (2013.01)

(56) References Cited

U.S. PATENT DOCUMENTS

| | | |
|---|---|---|
| 2006/0033136 A1* | 2/2006 | Liu ......................... H01L 43/08 257/296 |
| 2012/0103792 A1 | 5/2012 | Kent et al. |
| 2013/0187248 A1* | 7/2013 | Kariyada ............. G11C 11/161 257/425 |
| 2014/0175577 A1 | 6/2014 | Apalkov et al. |
| 2018/0097174 A1 | 4/2018 | Allenspach et al. |
| 2019/0206931 A1 | 7/2019 | Gajek et al. |
| 2019/0207084 A1 | 7/2019 | Tzoufras et al. |
| 2019/0207102 A1 | 7/2019 | Gajek et al. |
| 2019/0273202 A1* | 9/2019 | Nikitin .................. G11C 11/155 |
| 2019/0392881 A1* | 12/2019 | Rakshit ................... H01L 43/08 |
| 2021/0005235 A1* | 1/2021 | Min ........................ H01L 43/04 |

FOREIGN PATENT DOCUMENTS

| | | |
|---|---|---|
| CN | 102376738 A | 3/2012 |
| CN | 103887425 A | 6/2014 |

* cited by examiner

MEGNETORESISTIVE RANDOM ACCESS MEMORY

CROSS-REFERENCE TO RELATED APPLICATION

This application is a continuation of International Application No. PCT/CN2019/127828, filed on Dec. 24, 2019, the entire content of which is incorporated herein by reference.

FIELD OF THE TECHNOLOGY

This application relates to the field of magnetoresistive random access memory (MRAM) and, more specifically, to a Spin Hall Effect MRAM (SHE-MRAM) and a method of using the same.

BACKGROUND OF THE DISCLOSURE

Spin Hall Effect (SHE) based magnetoresistive random access memory (MRAM) is a type of nonvolatile memory that has a low write current, fast read speed, and zero leakage. An SHE-MRAM includes a magnetic tunnel junction (MTJ) disposed adjacent to a heavy metal. The MTJ includes a reference layer, a tunnel barrier layer, and a free layer, where the tunnel barrier layer is sandwiched between the reference and free layers. The tunnel barrier layer includes a thin insulating layer. The reference and free layers are ferromagnetic. In the operation of the SHE-MRAM device, the magnetization direction of the reference layer is fixed, while the magnetization direction of the free layer is switchable. The magnetization direction of the free layer is used to store information.

SUMMARY

In one aspect of the present disclosure, a magnetic memory device includes a core element, a free layer, a barrier layer, and a reference layer. The free layer surrounds the core element. The barrier layer surrounds the free layer. The reference layer surrounds the barrier layer. The core element includes a metallic material and two ends of the core element are electrically coupled to a first electrode and a second electrode, respectively. A direction of magnetization of the free layer is switchable between a first direction and a second direction under an influence of an electrical current that flows along the core element. The barrier layer includes an electrically insulating material. The reference layer is electrically coupled to a third electrode. A direction of magnetization of the reference layer remains along the first direction or the second direction.

In another aspect of the present disclosure, a memory device includes a first electrode, a second electrode, and a third electrode. A method for operating the memory device includes applying a read input current to the memory device via the third electrode, reading a first output current and a second output current via the first electrode and a second electrode respectively, and comparing a difference between the first output current and the second output current with a threshold to determine whether data stored in the memory device is credible.

In another aspect of the present disclosure, another magnetic memory device includes multiple memory cells. The multiple memory cells are disposed around a common central axis. Each of the multiple memory cells includes a metal layer, a free layer adjacent to the metal layer, a barrier layer adjacent to the free layer, and a reference layer adjacent to the barrier layer. The free layer is disposed between the metal layer and the barrier layer. The barrier layer is disposed between the free layer and the reference layer. The metal layer includes a metallic material. Two ends of the metal layer are electrically coupled to a first electrode and a second electrode, respectively. A direction of magnetization of the free layer is switchable between a first direction and a second direction under an influence of an electric current that flows along the metal layer. The barrier layer includes an electrically insulating material. The reference layer is electrically coupled to a third electrode. A direction of magnetization of the reference layer remains along the first direction or the second direction.

Other aspects of the present disclosure can be understood by those skilled in the art in light of the description, the claims, and the drawings of the present disclosure.

DESCRIPTION OF EMBODIMENTS

The following describes the technical solutions in the embodiments of the present disclosure with reference to the accompanying drawings. Wherever possible, the same reference numbers will be used throughout the drawings to refer to the same or like parts. Apparently, the described embodiments are merely some but not all the embodiments of the present disclosure. Other embodiments obtained by a person skilled in the art based on the embodiments of the present disclosure without creative efforts shall fall within the protection scope of the present disclosure.

Figure 1A:
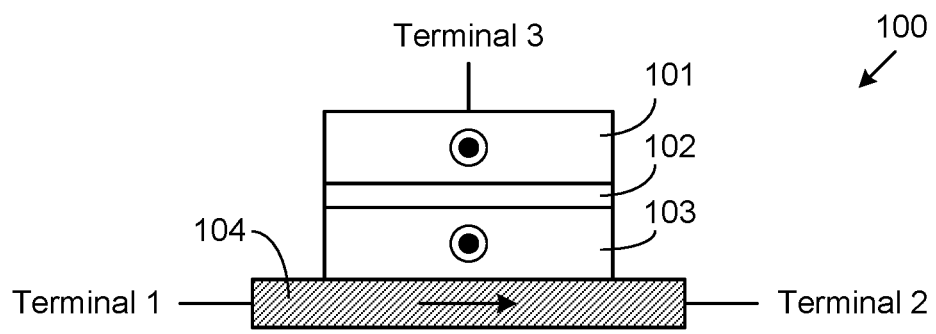
FIGS. 1A and 1B illustrate schematic structural diagrams of a Spin Hall Effect magnetoresistive random access memory (SHE-MRAM) device.
Figure 1B:
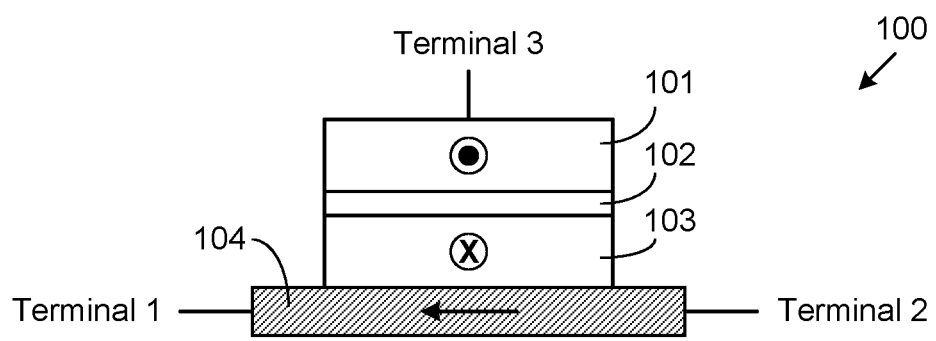

FIGS. 1A and 1B schematically show the structure of an example Spin Hall Effect magnetoresistive random access memory (SHE-MRAM) device 100. FIGS. 1A and 1B are cross-sectional views of the device 100, which includes a reference layer 101, a barrier layer 102, a free layer 103, and a metal layer 104. As shown in FIGS. 1A and 1B, two ends of the metal layer 104 are electrically coupled to terminals 1 and 2, respectively, and the reference layer 101 is coupled to terminal 3. The reference layer 101 may include a ferromagnetic material. The magnetization direction of the reference layer 101 can be stable and fixed during the operation of the device 100. The free layer 103 may also include a ferromagnetic material. The magnetization direction of the free layer 103 can also be stable, but can be switched under certain external influence, such as an electric current flowing in the metal layer 104. The barrier layer 102 can include an electrically insulating material that may be non-magnetic or weakly magnetic. The barrier layer 102 can be designed, for example, the thickness and/or material of the barrier layer 102 can be selected, such that an electric current may flow across layer 102 due to quantum tunneling.

The reference layer 101, the barrier layer 102, and the free layer 103 form a magnetic tunnel junction (MTJ). The electrical resistance of the MTJ can depend on the magnetization of the reference layer 101 and the free layer 103. When the magnetization states of the reference layer 101 and the free layer 103 are parallel (i.e., when the magnetization directions of the two layers are the same, as shown in FIG. 1A), the resistance of the MTJ is relatively low. On the other hand, when the magnetization states of the reference layer 101 and the free layer 103 are anti-parallel (i.e., when the magnetization directions of the two layers are opposite to each other, as shown in FIG. 1B), the resistance is relatively high. As such, the relative orientation of the magnetization direction of the free layer 103 with respect to the reference layer 101, and hence the resistance of the MTJ, can be used to store information. For example, the low resistance state of the MTJ can indicate data "1" while the high resistance state of the MTJ can indicate data "0".

As the magnetization direction of the reference layer 101 is fixed, the change of the magnetization direction of the free layer 103 may be utilized to change the information stored in the device 100. The magnetization state of the free layer 103 may be switched using an electric current applied to the metal layer 104. The electric current in the metal layer 104 can function as the write current of the device 100.

Referring to FIG. 1A, when an electric current flows from terminal 1 to terminal 2 through the metal layer 104, i.e., along the longitudinal direction of the metal layer 104, a corresponding spin current in the transverse direction can be created, causing spin accumulation at the boundaries of the metal layer 104. As the free layer 103 is adjacent to the metal layer 104, due to spin orbit interactions, the magnetization state of the free layer 103 may be affected by the direction of the net spin at the interface between the metal layer 104 and the free layer 103, which in turn depends on the direction of the electric current in the metal layer 104. As such, with the electric current direction shown in FIG. 1A, the magnetization of the free layer 103 is in a direction pointing out of the page. In this scenario, the magnetizations of the reference layer 101 and the free layer 103 are parallel, and the resistance of the MTJ measured via terminals 1 and 3 or 2 and 3 is relatively low.

When the electric current changes direction, such as flowing from terminal 2 to terminal 1 as shown in FIG. 1B, the spin current changes direction, and the direction of the accumulated spin at the boundaries of the metal layer 104 also changes to the opposite. Therefore, the magnetization of the free layer 103 is switched to a direction pointing into the page, as shown in FIG. 1B. As a result, the magnetizations of the reference layer 101 and the free layer 103 become anti-parallel, and the resistance of the MTJ measured via terminals 1 and 3 or 2 and 3 becomes relatively high.

Thus, the write process of the SHE-MRAM device 100 may be performed by applying an electric current along the metal layer 104 and the read process may be performed by measuring electrical resistance of the MTJ.

Figure 2A:
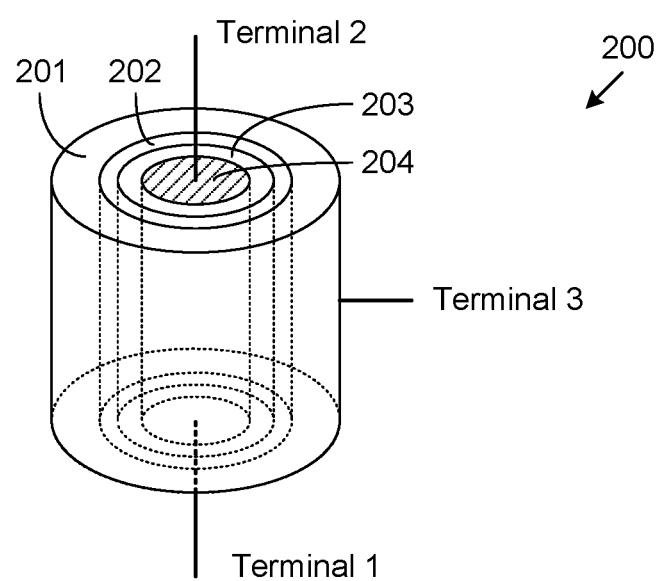
FIGS. 2A, 2B, 2C, and 2D illustrate schematic structural diagrams of another SHE-MRAM device according to an embodiment of the present disclosure.
Figure 2B:
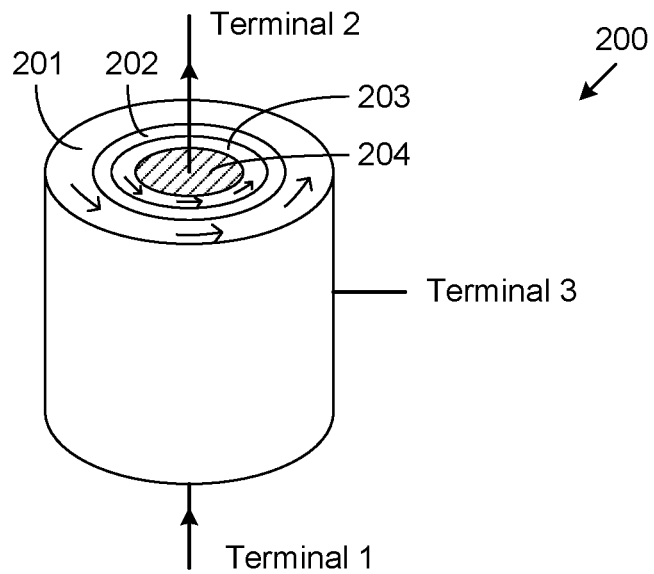
Figure 2C:
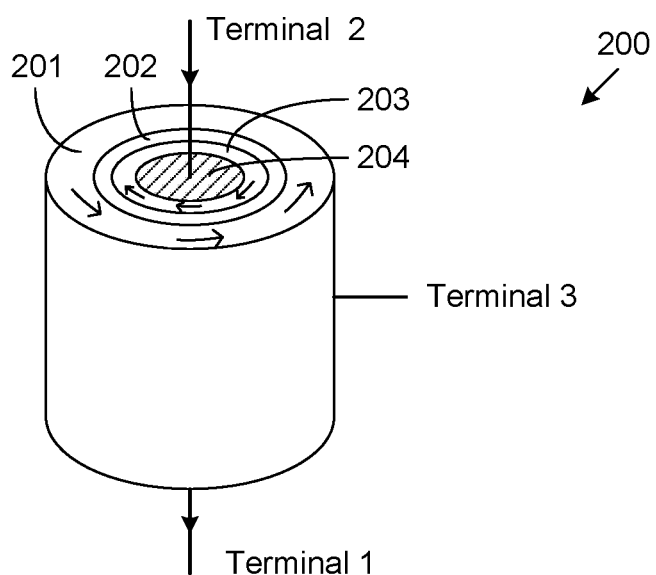
Figure 2D:
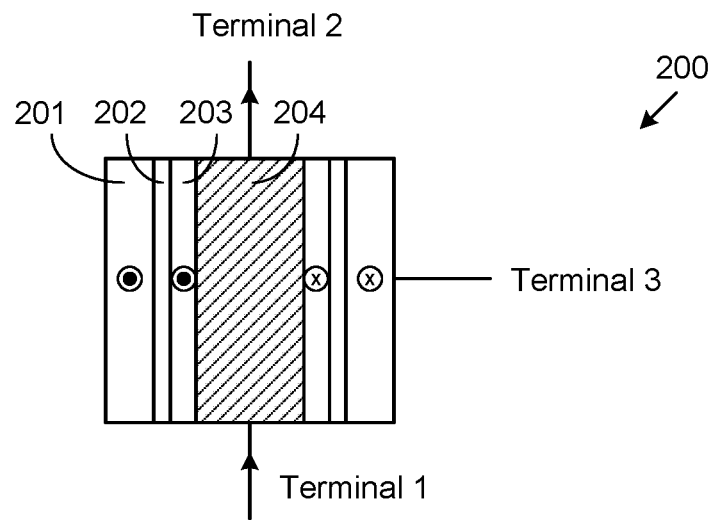

FIGS. 2A, 2B, 2C, and 2D schematically show the structure of another example SHE-MRAM device 200, consistent with embodiments of the present disclosure. FIGS. 2A-2C are perspective views of the device 200 and FIG. 2D is a cross-sectional view of the device 200. The device 200 includes a reference layer 201, a barrier layer 202, a free layer 203, and a metal core element or metal core 204. The reference layer 201 may include a ferromagnetic material such as $Co_2Fe_6B_2$. The free layer 203 may also include a ferromagnetic material such as $Co_2Fe_6B_2$. The barrier layer 202 may include an electrically insulating material such as MgO. The metal core 204 may be made of a heavy metal such as tungsten (W), tantalum (Ta), platinum (Pt), or hafnium (Hf).

As shown in FIGS. 2A-2D, the metal core 204 may have a cylindrical shape. The reference layer 201, the barrier layer 202, and the free layer 203 may be concentric cylindrical structures such as concentric cylindrical shells in regard to a common central axis, which may be the central axis of the metal core 204. The metal core 204 is surrounded by the free layer 203. The free layer 203 is surrounded by the barrier layer 202. The barrier layer 202 is surrounded by the reference layer 201. In addition, two ends of the metal core 204 may be electrically coupled to terminals 1 and 2, respectively, and the reference layer 201 may be coupled to terminal 3.

In the embodiment shown in FIGS. 2A-2D, the reference layer 201, the barrier layer 202, and the free layer 203 form an MTJ. The electrical resistance of the MTJ can depend on the magnetizations of the reference layer 201 and the free layer 203. When the magnetizations of the reference layer 201 and the free layer 203 are parallel (i.e., when the magnetization directions of the two layers are the same, as shown in FIGS. 2B and 2D), the resistance of the MTJ is relatively low. On the other hand, when the magnetizations of the reference layer 201 and the free layer 203 are anti-parallel (i.e., when the magnetization directions of the two layers are opposite to each other, as shown in FIG. 2C), the resistance of the MTJ is relatively high. As such, the relative orientation of the magnetization direction of the free layer 203 with respect to the magnetization direction of the reference layer 201, and hence the resistance of the MTJ, can be used to store information. For example, the low resistance state of the MTJ can indicate data "1" while the high resistance state of the MTJ can indicate data "0".

As the magnetization direction of the reference layer 201 is fixed, the change of the magnetization direction of the free layer 203 may be utilized to change the information stored in the device 200. The magnetization state of the free layer 203 may be switched using an electric current applied to the metal core 204. The electric current in the metal core 204 can function as the write current of the device 200.

Referring to FIG. 2B, when an electric current flows from terminal 1 to terminal 2 through the metal core 204, i.e., along the axial direction of the metal core 204, a corresponding spin current in the transverse direction can be created, causing spin accumulation at the boundary of the metal core 204. For example, spins can wind around a lateral boundary of the metal core 204 when an electric current passes through the metal core 204. As the free layer 203 is adjacent to the metal core 204, due to spin orbit interactions, the magnetization state of the free layer 203 may be affected by the direction of the net spin at the interface between the metal core 204 and the free layer 203, which in turn depends on the direction of the electric current in the metal core 204. Hence, with the electric current direction shown in FIG. 2B, the magnetization of the free layer 203 is along the counterclockwise direction when looking from above in the figure. That is, the magnetizations of the reference layer 201 and the free layer 203 are parallel, and hence the resistance of the MTJ measured via terminals 1 and 3 or 2 and 3 is relatively low.

When the electric current changes direction, such as flowing from terminal 2 to terminal 1 as shown in FIG. 2C, the spin current changes direction, and the direction of the accumulated spin at the boundary of the metal core 204 also changes to the opposite. Therefore, the magnetization of the free layer 203 is switched to the clockwise direction when looking from above in the figure, as shown in FIG. 1B. As a result, the magnetizations of the reference layer 201 and the free layer 203 become anti-parallel, and the resistance of the MTJ measured via terminals 1 and 3 or 2 and 3 becomes relatively high.

Thus, the write process of the SHE-MRAM device 200 may be performed by applying an electric current along the metal core 204 and the read process may be performed by measuring electrical resistance of the MTJ.

Figure 3:
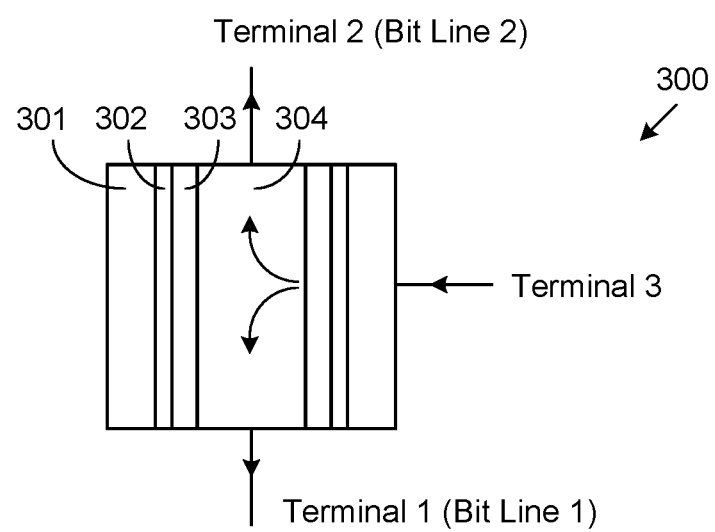
FIG. 3 illustrate a schematic structural diagram of another SHE-MRAM device according to another embodiment of the present disclosure.

FIG. 3 schematically shows a structure of another example SHE-MRAM device 300 in a cross-sectional view, consistent with embodiments of the present disclosure. The device 300 has a similar structure and includes similar materials to the device 200 shown in FIGS. 2A-2D. As shown in FIG. 3, the device 300 includes a reference layer 301, a barrier layer 302, a free layer 303, and a metal core 304. The metal core 304 may have a cylindrical shape. The reference layer 301, the barrier layer 302, and the free layer 303 may be concentric cylindrical structures such as concentric cylindrical shells in regard to a common central axis, which may be the central axis of the metal core 304. The metal core 304 is surrounded by the free layer 303. The free layer 303 is surrounded by the barrier layer 302. The barrier layer 302 is surrounded by the reference layer 301. Terminals 1, 2, and 3 are electrically coupled to two ends of the metal core 304 and the reference layer 301, respectively.

The reference layer 301 may include a ferromagnetic material. The magnetization direction of the reference layer 301 is fixed during the operation of the device 300. The free layer 303 may also include a ferromagnetic material. The magnetization direction of the free layer 303 may be switched between two directions under certain external influence. The metal core 304 may include a heavy metal. The reference layer 301, the barrier layer 302, and the free layer 303 form an MTJ and the resistance of the MTJ can be used to store information.

When the magnetizations of the reference layer 301 and the free layer 303 are parallel, the resistance of the MTJ is relatively low. When the magnetizations of the reference layer 301 and the free layer 303 are anti-parallel, the resistance of the MTJ is relatively high. The change of the magnetization direction of the free layer 303 may be utilized to change the information stored in the device 300. The magnetization of the free layer 303 may be switched using an electric current applied to the metal core 304 via terminals 1 and 2. The electric current can work as the write current of the device 300.

The read process of the device 300 can be performed under one of several operation modes. In a first operation mode of the device 300, the read process may be performed by measuring resistance of the MTJ via terminals 2 and 3. In a second operation mode, the read process may be performed by measuring resistance of the MTJ via terminals 1 and 3. In both the first and second operation modes, a relatively high resistance level indicates that the magnetizations of the reference layer 301 and the free layer 303 are anti-parallel, and a relatively low resistance level indicates that the magnetizations of the reference and free layers 301 and 303 are parallel.

In a third operation mode, the read process is performed using terminals 1, 2, and 3. As shown in FIG. 3, terminals 1 and 2 are electrically coupled to bit lines 1 and 2, respectively, of a memory system, where the device 300 can constitute a memory cell of the memory system. After a read input current is applied to the terminal 3, two read output currents are generated. One read output current flows to terminal 1, and the other read output current flows to terminal 2. When the device 300 operates normally, the two read output currents can result in same or similar readings (e.g., electric current readings) from bit lines 1 and 2. The readings from bit lines in some scenarios, such as when the device 300 is degenerated and hence the data stored therein becomes incredible, the difference between the two readings from bit lines 1 and 2 may become larger than a threshold. When this occurs, adjustment of at least one of bit line 1 or the bit line 2 may be made to correct the error, e.g., to reduce the difference between the two readings. For example, the capacity of at least one of the bit line 1 or the bit line 2 may be tuned to reduce the difference between the two readings.

In some embodiments, a verification process can be performed after a write process to verify whether data is properly written into the device 300. In the verification process, a read input current is applied to terminal 3. Two readings of the read output current are obtained via bit lines 1 and 2, respectively. The difference between the two readings can be compared with a threshold to determine whether the data stored at the MTJ or the device 300 is credible. If the difference is smaller than the threshold, the stored data can be determined as credible and the verification process is completed. If the difference is larger than the threshold, one or both of bit lines 1 and 2 may be adjusted to reduce the difference. After the adjustment, the write process may be performed one more time. Then, the verification process can be performed to check the difference between the two readings from bit lines 1 and 2 again. The above-described processes can be repeatedly performed until the difference between the two readings from bit lines 1 and 2 is smaller than the threshold. The method may reduce write errors.

Figure 4A:
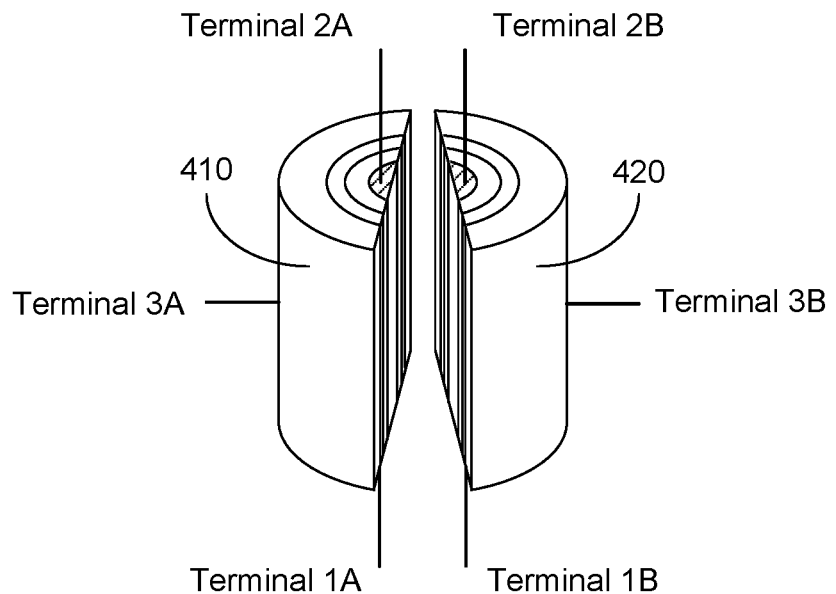
FIGS. 4A and 4B illustrate schematic structural diagrams of two SHE-MRAM devices according to another embodiment of the present disclosure.
Figure 4B:
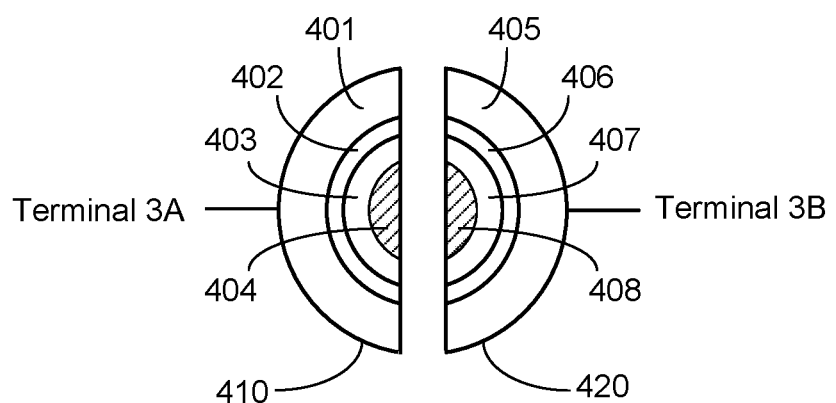

FIGS. 4A and 4B schematically show the structures of example SHE-MRAM devices 410 and 420 in a perspective view and a cross-sectional view, respectively, consistent with embodiments of the present disclosure. The devices 410 and 420 may have similar structures and include same or similar materials. The devices 410 and 420 may be made based on the device 200 shown in FIGS. 2A-2D. In one embodiment, after the cylindrical structure including multiple concentric layers shown in FIGS. 2A-2D is made, a separation process can be performed to form a trench or gap by, e.g., removing a middle portion of the cylindrical structure along the central common axis of the cylindrical structure. For example, the separation process may be implemented by dry etching. The trench or gap may be left open or filled with an electrically insulating material like silicon dioxide or silicon nitride. Basic structures of the SHE-MRAM devices 410 and 420 are formed after the cylindrical structure is split into two parts in this embodiment. In some embodiments, the devices 410 and 420 can be symmetric to each other.

As shown in FIGS. 4A and 4B, the device 410 includes a reference layer 401, a barrier layer 402, a free layer 403, and a metal core 404, and the device 420 includes a reference layer 405, a barrier layer 406, a free layer 407, and a metal core 408. The devices 410 and 420 may be arranged around the common central axis. The reference layers, barrier layers, and free layers of the devices 410 and 420 may be partial cylindrical structures such as partial cylindrical shells which are concentric in regard to the common central axis. The metal cores 404 and 408 each have a shape of a partial half cylinder and are adjacent to the free layers 403 and 407, respectively. The free layers 403 and 407 are adjacent to the barrier layers 402 and 406, respectively, and the barrier layers 402 and 406 are adjacent to the reference layers 401 and 405, respectively. The free layer of each of the devices 410 and 420 is disposed between a corresponding metal core and a corresponding barrier layer. The barrier layer of each of the devices 410 and 420 is disposed between a corresponding free layer and a corresponding reference layer. Terminals 1A, 2A, and 3A are electrically coupled to two ends of the metal core 404 and the reference layer 401, respectively. Terminals 1B, 2B, and 3B are electrically coupled to two ends of the metal core 408 and the reference layer 405, respectively.

As the devices 410 and 420 are similar in terms of structure and materials, discussions below focus on the device 410, which may be readily applied to the device 420. In the device 410, the reference layer 401, the barrier layer 402, and the free layer 403 form an MTJ.

The reference layer 401 may include a ferromagnetic material. The magnetization direction of the reference layer 401 is fixed during the operation of the device 410. The free layer 403 may also include a ferromagnetic material. The magnetization direction of the free layer 403 may be switched between two directions. The metal core 404 may include a heavy metal. The resistance of the MTJ formed by the reference layer 401, the barrier layer 402, and the free layer 403 can be used to store information.

When the magnetizations of the reference layer 401 and the free layer 403 are parallel, the resistance of the MTJ is relatively low. When the magnetizations of the reference layer 401 and the free layer 403 are anti-parallel, the resistance of the MTJ is relatively high. The change of the magnetization direction of the free layer 403 may be utilized to change the information stored in the device 410. The magnetization of the free layer 403 may be switched using an electric current applied to the metal core 404 via terminals 1A and 2A. The electric current can work as the write current of the device 410.

For example, when an electric current flows from terminal 1A to terminal 2A through the metal core 404, i.e., along the axial direction of the metal core 404, a corresponding spin current in the transverse direction can be created, causing spin accumulation at the boundaries of the metal core 404. As the free layer 403 is adjacent to the metal core 404, the magnetization state of the free layer 403 may be affected by the direction of the net spin at the interface between the metal core 404 and the free layer 403, which in turn depends on the direction of the electric current in the metal core 404. Thus, when the electric current flows from terminal 1A to terminal 2A, the magnetization of the free layer 403 is along the counter-clockwise direction when looking from above in the figure. When the electric current flows from terminal 2A to terminal 1A, the magnetization of the free layer 403 is along the clockwise direction when looking from above in the figure. Thus, the write process of the SHE-MRAM device 410 may be performed by applying an electric current along the metal core 404 and the read process may be performed by measuring electrical resistance of the MTJ in the device 410 via terminals 1A and 3A or 2A and 3A.

Similarly, the write process of the device 420 may be performed by applying an electric current along the metal core 408 via terminals 1B and 2B. And the read process may be performed by measuring the electrical resistance of the MTJ In the device 420 via terminals 1B and 3B or 2B and 3B.

Figure 5A:
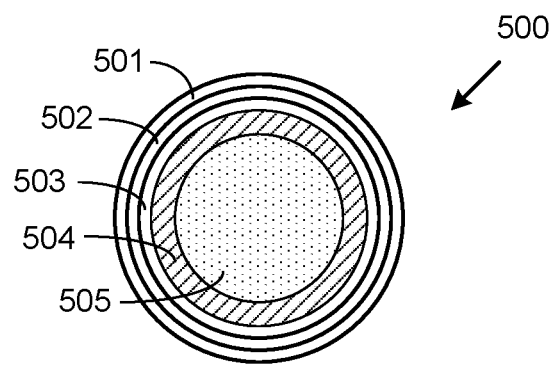
FIGS. 5A, 5B, and 5C illustrate schematic structural diagrams of multiple SHE-MRAM devices according to another embodiment of the present disclosure.

FIG. 5A schematically shows the structure of another example SHE-MUM device 500 in a cross-sectional view, consistent with embodiments of the present disclosure. The device 500 has a similar structure to the SHE-MRAM device 200 shown in FIG. 2A-2D except that the device 500 includes a metal layer 504 and an insulating core 505 instead of the metal core 204 of the device 200. As shown in FIG. 5A, the device 500 has a cylindrical structure and includes a reference layer 501, a barrier layer 502, a free layer 503, the metal layer 504, and the insulating core 505. The insulating core 505 may have a cylindrical shape with a central axis. The reference, barrier, free, and metal layers of the device 500 may be concentric cylindrical structures such as concentric cylindrical shells in regard to a common central axis, which can be the central axis of the insulating core 505. The insulating core 505 is surrounded by the metal layer 504. The metal layer 504 is surrounded by the free layer 503. The free layer 503 is surrounded by the barrier layer 502. The barrier layer 502 is surrounded by the reference layer 501.

As shown in FIG. 5A, the reference layer 501, the barrier layer 502, and the free layer 503 form an MTJ. The reference layer 501 may include a ferromagnetic material. The magnetization direction of the reference layer 501 is fixed during the operation of the device 500. The free layer 503 may also include a ferromagnetic material. The magnetization direction of the free layer 503 may be switched between two directions. The barrier layer 502 may include an electrically insulating material. The metal layer 504 may include a heavy metal. The insulating core 505 may include an electrically insulating material such as silicon dioxide or silicon nitride. Again, the resistance of the MTJ can be used to store information. For example, the change of the magnetization direction of the free layer 503 may be utilized to change the information stored in the device 500. Similar to aforementioned embodiments, the magnetization of the free layer 403 may be switched using an electric current applied to the metal layer 504. The electric current can work as the write current of the device 500.

For example, when an electric current flows in a direction pointing out of the page through the metal layer 504, a corresponding spin current in the transverse direction can be created, causing spin accumulation at the boundaries of the metal layer 504. As the free layer 503 is adjacent to the metal layer 504, the magnetization state of the free layer 503 may be affected by the direction of the net spin at the interface between the metal layer 504 and the free layer 503, which in turn depends on the direction of the electric current in the metal layer 504. Thus, when the electric current flows in a direction pointing out of the page, the magnetization of the free layer 503 is along the counter-clockwise direction in the figure. When the electric current flows in a direction pointing into the page, the magnetization of the free layer 503 is along the clockwise direction in the figure. As such, the write process of the SHE-MRAM device 500 may be performed by applying an electric current along the metal layer 504 and the read process may be performed by measuring electrical resistance of the MTJ in the device 500.

Figure 5B:
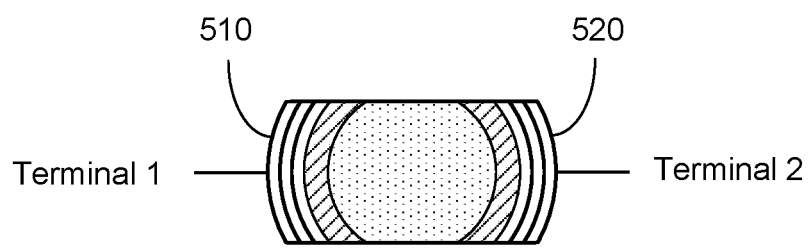

FIG. 5B schematically shows the structures of example SHE-MRAM devices 510 and 520 in a cross-sectional view, respectively, consistent with embodiments of the present disclosure. The devices 510 and 520 are based on the device 500 shown in FIG. 5A. In one embodiment as shown in FIG. 5B, the devices 510 and 520 may be fabricated by removing a first portion and a second portion from the device 500. The removing process, for example, may be performed by dry etching with an etching direction parallel to the common central axis of the device 500. The first and second portions are on the opposite sides of the common central axis of the device 500, which is also the common central axis of the devices 510 and 520. The first and second portions may be symmetric and each include parts of the reference layer 501, the barrier layer 502, the free layer 503, the metal layer 504, and the insulation core 505. Basic structures of the devices 510 and 520 may be formed after removing the first and second portions from the device 500. The devices 510 and 520 are electrically isolated from each other and separated by one or more electrically insulating regions, such as the remaining part of the insulating core 505. The devices 510 and 520 may be arranged around the common central axis and each have a reference layer (a portion of the reference layer 501), a barrier layer (a portion of the barrier layer 502), a free layer (a portion of the free layer 503), and a metal layer (a portion of the metal layer 504). The reference, barrier, free, and metal layers of the devices 510 and 520 may be partial concentric cylindrical structures such as partial concentric cylindrical shells in regard to the common central axis. The remaining part of the insulating core 505 has a pillar shape whose central axis remains to be the common central axis.

In some embodiments, the devices 510 and 520 each have the following structural features: The metal layer is adjacent to the free layer, the free layer is adjacent to the barrier layer, and the barrier layer is adjacent to reference layer. Each free layer is disposed between a corresponding metal layer and a corresponding barrier layer. Each barrier layer is disposed between a corresponding free layer and a corresponding reference layer.

As shown in FIG. 5B, terminals 1 and 2 are electrically coupled to the reference layers of the devices 510 and 520, respectively. As the devices 510 and 520 are based on the device 500, the devices 510 and 520 can include the same materials. The devices 510 and 520 also function in the same or similar manner. For instance, the devices 510 and 520 each include an MTJ formed by the reference, barrier, and free layers. The resistance of the MTJs may be used to read information stored in the devices 510 and 520, respectively.

As the devices 510 and 520 have the same or similar structures and include the same materials, discussions below focus on the device 510, which may be readily applied to the device 520.

In the device 510, the reference layer and the free layer may include a ferromagnetic material. The magnetization direction of the reference layer is fixed during the operation of the device 510. The magnetization direction of the free layer may be switched between two directions. Similar to the embodiments discussed above, the resistance of the MTJ in the device 510 can be used to store information in the device 510. The change of the magnetization direction of the free layer may be utilized to change the information stored in the device 510. The magnetization of the free layer may be switched using an electric current applied to the metal layer. The electric current can work as the write current of the device 510.

For example, the magnetization state of the free layer may depend on the direction of the electric current flowing in the metal layer in the device 510. When the electric current flows in a direction pointing out of the page, the magnetization of the free layer is along the counter-clockwise direction in the figure. When the electric current flows in a direction pointing into the page, the magnetization of the free layer is along the clockwise direction in the figure. Thus, the write process of the SHE-MRAM device 510 may be performed by applying an electric current along the metal layer and the read process may be performed by measuring electrical resistance of the MTJ in the device 510.

Similarly, the write process of the device 520 may be performed by applying an electric current along the metal layer of the device 520. And the read process may be performed by measuring the electrical resistance of the MTJ in the device 520.

Figure 5C:
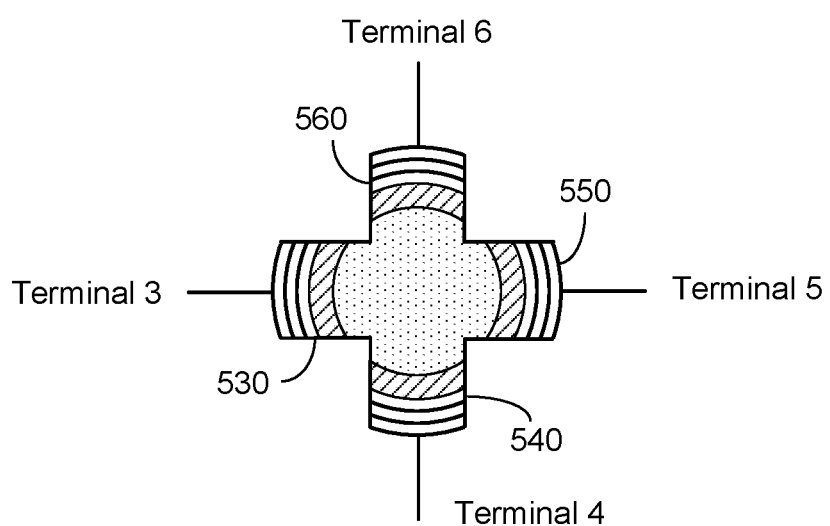

FIG. 5C schematically shows the structures of example SHE-MRAM devices 530, 540, 550, and 560 in a cross-sectional view, respectively, consistent with embodiments of the present disclosure. Similar to the devices 510 and 520, the devices 530-560 are also based on the device 500 shown in FIG. 5A. The devices 530-560 may be configured around a common central axis which can be the common central axis of the device 500. In some embodiments, as shown in FIG. 5C, the devices 530-560 may be fabricated by removing four portions from the device 500. The removing process may be performed, for example, by dry etching with etching direction parallel to the common central axis. The four portions may have the same or similar cross-sections in a plane perpendicular to the common central axis. The four portions each may include parts of the reference layer 501, the barrier layer 502, the free layer 503, the metal layer 504, and the insulation core 505 of the device 500. The devices 530-560 may have the same or similar shapes and dimensions. The devices 530-560 are electrically isolated from each other and may be separated by electrically insulating regions, such as the remaining part of the insulating core 505. The devices 530-560 each have a reference layer (a portion of the reference layer 501), a barrier layer (a portion of the barrier layer 502), a free layer (a portion of the free layer 503), a metal layer (a portion of the metal layer 504). In some embodiments, the reference layers, the barrier layers, the free layers, and the metal layers of the devices 530-560 may form partial concentric cylindrical structures such as partial concentric cylindrical shells in regard to the common central axis. Hence, any two or more layers among the reference, barrier, free, and metal layers of the device 530-560 may be concentric on the common central axis. The remaining part of the insulating core 505 has a pillar shape whose central axis remains to be the common central axis.

In some embodiments, the devices 530-560 each have the following structural features: The metal layer is adjacent to the free layer. The free layer is adjacent to the barrier layer. The barrier layer is adjacent to reference layer. Each free layer is disposed between a corresponding metal layer and a corresponding barrier layer. Each barrier layer is disposed between a corresponding free layer and a corresponding reference layer.

As shown in FIG. 5C, terminals 3, 4, 5, and 6 are electrically coupled to the reference layers of the devices 530-560, respectively. As the device 500 is the common building block, the devices 530-560 can include the same materials. The devices 530-560 each include an MTJ formed by the reference layer, barrier layer, and free layer. The resistance of the MTJs may be used to read information stored in the devices 530-560, respectively.

As the devices 530-560 can have the same or similar structures with the same materials and/or same functions, discussions below focus on the device 530, which may be readily applied to the devices 540, 550, and 560.

In the device 530, the reference layer and the free layer may include a ferromagnetic material. The magnetization direction of the reference layer is fixed during the operation of the device 530. The magnetization direction of the free layer may be switched between two directions. Similar to the embodiments discussed above, the resistance of the MTJ in the device 530 can be used to store information in the device 530. The change of the magnetization direction of the free layer may be utilized to change the information stored in the device 530. The magnetization of the free layer may be switched using an electric current applied to the metal layer. The electric current can work as the write current of the device 530.

For example, the magnetization state of the free layer may depend on the direction of the electric current flowing in the metal layer in the device 530. When the electric current flows in a direction pointing out of the page, the magnetization of the free layer is along the counter-clockwise direction when looking from above in the figure. When the electric current flows in a direction pointing into the page, the magnetization of the free layer is along the clockwise direction when looking from above in the figure. Thus, the write process of the SHE-MRAM device 530 may be performed by applying an electric current along the metal layer and the read process may be performed by measuring electrical resistance of the MTJ in the device 530.

Similarly, the write process of the devices 540-560 may be performed by applying an electric current along a corresponding metal layer, respectively. And the read process of the devices 540-560 may be performed by measuring the electrical resistance of a corresponding MTJ, respectively.

In the examples shown in FIGS. 5A, 5B, and 5C, the outmost layer is a reference layer and the layers follow the following order in an inward direction: reference layer, barrier layer, free layer, and metal layer. In some other embodiments, the layer order may be reversed. For example, an alternative layer order from the outermost layer to the innermost layer for an MTJ may be as follows: metal layer, free layer, barrier layer, and reference layer. As such, the metal layer becomes the outermost layer and the reference layer becomes an inner layer or the innermost layer. An SHE-MRAM device having the alternative layer order may have functionalities same as or similar to those of the devices 500, 510, 520, and 530-560 in FIGS. 5A-5C.

Similarly in some other embodiments, the layers may be reversed in the SHE-MRAM devices 200, 300, 410, and 420 shown in FIGS. 2A-2D, 3, 4A, and 4B. For example, a metal layer may be added to the outermost layers of the devices shown in FIGS. 2A-2D, 3, 4A, and 4B and become the new outermost layer. For example, an alternative layer order from the outermost layer to the innermost layer for an MTJ may be as follows: metal layer, free layer, barrier layer, and reference layer. As such, the reference layer becomes an inner layer or the innermost layer of the MTJ. An SHE-MRAM device having the alternative layer order may have functionalities same as or similar to those of the devices 200, 300, 410, and 420 shown in FIGS. 2A-2D, 3, 4A, and 4B.

The example arrangements shown in FIGS. 4A, 4B, 5B, and 5C each include two or more SHE-MRAM devices. The devices of each arrangement, such as the devices 410 and 420, the devices 510 and 520, or the devices 530-560, may have the same or different dimensions in a plane perpendicular to a corresponding common central axis. The devices of each arrangement shown in FIGS. 4A, 4B, 5B, and 5C may be evenly or unevenly distributed around the common central axis. The devices of each arrangement as shown in FIGS. 4A, 4B, 5B, and 5C may be symmetric or asymmetric about the common central axis.

Optionally, the methods discussed for the SHE-MRAM device 300 shown in FIG. 3 may be applied to other SHE-MRAM devices in the present disclosure, such as the devices 410, 420, 500, 510, 520, and 530-560. For example, two readings of the read output currents may be obtained for each device or selected devices through two bit lines coupled to the device(s). If the difference between the two readings is larger than a threshold, at least one bit line may be adjusted to correct the error.

Each of the aforementioned example embodiments, as shown in FIGS. 2A-2D, 3, 4A, 4B, and 5A-5C, includes one or more SHE-MRAM devices. Each embodiment may represent a design of an SHE-MRAM cell when the embodiment includes one SHE-MRAM device. Additionally, each embodiment may represent a design of an SHE-MRAM sub-array when the embodiment includes more than one SHE-MRAM device. For example, the embodiment in FIG. 5C includes four SHE-MRAM devices and may represent an SHE-MRAM sub-array that includes four SHE-MRAM cells. Such an SHE-MRAM single cell and/or sub-array may be used to as a building unit to create a two-dimensional (2D) or three-dimensional (3D) array for a 2D or 3D memory device.

Although the principles and implementations of the present disclosure are described by using specific embodiments in the specification, the foregoing descriptions of the embodiments are only intended to help understand the method and core idea of the method of the present disclosure. Meanwhile, a person of ordinary skill in the art may make modifications to the specific implementations and application range according to the idea of the present disclosure. In conclusion, the content of the specification should not be construed as a limitation to the present disclosure.

What is claimed is:

1. A magnetic memory device, comprising:
   a core element comprising a metallic material, two ends of the core element being configured to electrically couple to a first electrode and a second electrode, respectively, wherein the first electrode and the second electrode are electrically coupled to two separate bit lines of a memory system, respectively;
   a free layer at least partially surrounding the core element, a direction of magnetization of the free layer being switchable between a first direction and a second direction under an influence of an electrical current flowing along the core element;
   a barrier layer at least partially surrounding the free layer, the barrier layer comprising an electrically insulating material;
   a reference layer at least partially surrounding the barrier layer and being configured to electrically couple to a third electrode, a direction of magnetization of the reference layer remaining along the first direction or the second direction, and
   an adjustment mechanism configured to adjust at least one of the two separate bit lines when a difference between readings of output currents from the two separate bit lines is larger than a threshold.

2. The device according to claim 1, wherein the core element includes a cylindrical element.

3. The device according to claim 1, wherein the free layer, the barrier layer, and the reference layer form three concentric cylindrical structures.

4. The device according to claim 1, wherein the adjustment mechanism is configured to adjust a capacity of the at least one of the two separate bit lines.

5. The device according to claim 1, wherein the free layer includes a first ferromagnetic layer and the reference layer includes a second ferromagnetic layer.

6. The device according to claim 1, further including:
   a plurality of memory cells, the plurality of memory cells being disposed around a common central axis, each of the plurality of memory cells comprising:
      the core element disposed along the common central axis, and the free layer, the barrier layer, and the reference layer, that are at least partially surround the core element.

7. A method for operating a memory device including a first electrode, a second electrode, and a third electrode, comprising:
applying a read input current to the memory device via the third electrode;
reading a first output current and a second output current via the first electrode and a second electrode, respectively, wherein the first electrode and the second electrode are coupled to two separate bit lines, respectively;
comparing a difference between the first output current and the second output current with a threshold to determine whether data stored in the memory device is credible; and
in response to the difference being larger than the threshold, adjusting at least one of the two separate bit lines to reduce the difference.

8. The method according to claim 7, wherein adjusting the at least one of the two separate bit lines includes adjusting a capacity of the at least one of the two separate bit lines.

9. The method according to claim 7, wherein the memory device is a magnetic memory device including:
a core element comprising a metallic material, two ends of the core element being electrically coupled to the first electrode and the second electrode, respectively;
a free layer surrounding the core element, a direction of magnetization of the free layer being switchable between a first direction and a second direction under an influence of an electrical current flowing along the core element;
a barrier layer surrounding the free layer, the barrier layer comprising an electrically insulating material; and
a reference layer surrounding the barrier layer and electrically coupled to the third electrode, a direction of magnetization of the reference layer remaining along the first direction or the second direction;
the method further comprising:
applying a write current along the core element via the first electrode and the second electrode to cause the direction of magnetization of the free layer to align along the first direction or the second direction to write the data into the magnetic memory device.

10. A magnetic memory device, comprising:
an insulating core, the insulating core being electrically insulating;
a metal layer, disposed adjacent to the insulating core and two ends of the metal layer being electrically coupled to a first electrode and a second electrode, respectively, wherein the first electrode and the second electrode are coupled to two separate bit lines, respectively;
a free layer adjacent to the metal layer, a direction of magnetization of the free layer being switchable between a first direction and a second direction under an influence of an electric current flowing along the metal layer;
a barrier layer adjacent to the free layer and comprising an electrically insulating material, the free layer being disposed between the metal layer and the barrier layer;
a reference layer adjacent to the barrier layer and electrically coupled to a third electrode, a direction of magnetization of the reference layer remaining along the first direction or the second direction, the barrier layer being disposed between the free layer and the reference layer, and
an adjustment mechanism configured to adjust at least one of the two separate bit lines when a difference between readings of output currents from the two separate bit lines is larger than a threshold.

11. The device according to claim 10, wherein the metal layer, the free layer, the barrier layer, and the reference layer form a plurality of partial cylindrical structures, having each partial cylindrical structure adjacent to the insulating core.

12. The device according to claim 11, further comprising:
each partial cylindrical structure includes a portion of each of the metal layer, the free layer, the barrier layer, and the reference layer, and
the plurality of partial cylindrical structures are electrically insulating from each other.

13. The device according to claim 12, wherein two or more of the plurality of partial cylindrical structures are concentric about a common central axis.

14. The device according to claim 10, wherein the metal layer has a shape of a partial half cylinder.

15. The device according to claim 10, wherein the free layer includes a first ferromagnetic layer and the reference layer includes a second ferromagnetic layer.

16. The device according to claim 10, wherein the insulating core includes a cylindrical element.

17. The device according to claim 10, wherein at least one of the first electrode or the second electrode is electrically coupled to a bit line of a memory system.

18. The device according to claim 10, further including:
a plurality of memory cells, the plurality of memory cells being disposed around a common central axis, each of the plurality of memory cells comprising:
the insulating core disposed along the common central axis, the metal layer adjacent to the insulating core, the free layer adjacent to the metal layer, the barrier layer adjacent to the free layer, and the reference layer adjacent to the barrier layer.

* * * * *